United States Patent
Shin et al.

(10) Patent No.: US 10,629,848 B2
(45) Date of Patent: Apr. 21, 2020

(54) ORGANIC LIGHT-EMITTING DISPLAY DEVICE HAVING AN ENCAPSULATING LAYER

(71) Applicant: LG DISPLAY CO., LTD., Seoul (KR)

(72) Inventors: Young-Hoon Shin, Paju-si (KR); Min-Su Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/117,800

(22) Filed: Aug. 30, 2018

(65) Prior Publication Data

US 2019/0067641 A1  Feb. 28, 2019

(30) Foreign Application Priority Data

Aug. 31, 2017  (KR) .......................... 10-2017-0110729

(51) Int. Cl.
| | |
|---|---|
| *H01L 27/15* | (2006.01) |
| *H01L 51/52* | (2006.01) |
| *H01L 51/50* | (2006.01) |
| *H01L 27/32* | (2006.01) |

(52) U.S. Cl.
CPC ...... *H01L 51/5256* (2013.01); *H01L 27/3258* (2013.01); *H01L 51/5012* (2013.01); *H01L 51/5203* (2013.01); *H01L 51/529* (2013.01); *H01L 51/5253* (2013.01); *H01L 51/5259* (2013.01); *H01L 51/5268* (2013.01); *H01L 27/322* (2013.01); *H01L 27/3246* (2013.01)

(58) Field of Classification Search
CPC ............. H01L 51/5012; H01L 51/5256; H01L 51/5253; H01L 51/5203; H01L 27/3258
See application file for complete search history.

(56) References Cited

U.S. PATENT DOCUMENTS

| | | | |
|---|---|---|---|
| 10,199,443 B2* | 2/2019 | Lee | ..................... H01L 27/3251 |
| 2016/0064685 A1* | 3/2016 | Kim | ........................ B32B 3/266 |
| | | | 257/40 |
| 2016/0133874 A1* | 5/2016 | Kim | .................... H01L 51/5259 |
| | | | 257/40 |
| 2016/0216557 A1* | 7/2016 | Rho | .................. G02F 1/133528 |
| 2017/0003808 A1* | 1/2017 | Kim | ........................ G06F 3/044 |
| 2017/0040570 A1 | 2/2017 | Kim et al. | |

(Continued)

FOREIGN PATENT DOCUMENTS

| | | |
|---|---|---|
| JP | 2007-220593 A | 8/2007 |
| JP | 2015-216083 A | 12/2015 |

(Continued)

*Primary Examiner* — Hsien Ming Lee (74) *Attorney, Agent, or Firm* — Birch, Stewart, Kolasch & Birch, LLP (57) ABSTRACT

An organic light-emitting display device including an encapsulating layer for coupling an encapsulating substrate to a device substrate in which a light-emitting structure is formed, is provided. The encapsulating layer can include a lower encapsulating layer and an upper encapsulating layer which are sequentially disposed on the light-emitting structure. The lower encapsulating layer can be in direct contact with the light-emitting structure. The upper encapsulating layer can include a moisture-absorbing material. Thus, in the organic light-emitting display device, the permeation of external moisture can be prevented, and the heat dissipation can be improved.

17 Claims, 5 Drawing Sheets

(56) References Cited

U.S. PATENT DOCUMENTS

| | | | |
|---|---|---|---|
| 2017/0044405 A1 | 2/2017 | Yoo et al. | |
| 2017/0077440 A1 | 3/2017 | Yoo et al. | |
| 2017/0155086 A1 | 6/2017 | Kang | |
| 2017/0345880 A1* | 11/2017 | Kim | H01L 51/5253 |
| 2018/0123059 A1* | 5/2018 | Yang | H01L 51/003 |
| 2018/0151648 A1* | 5/2018 | Kim | H01L 27/3258 |

FOREIGN PATENT DOCUMENTS

| | | |
|---|---|---|
| JP | 2016-109771 A | 6/2016 |
| JP | 2016-115572 A | 6/2016 |

* cited by examiner

ORGANIC LIGHT-EMITTING DISPLAY DEVICE HAVING AN ENCAPSULATING LAYER

This application claims the priority benefit of Korean Patent Application No. 10-2017-0110729, filed on Aug. 31, 2017 in the Republic of Korea, which is hereby incorporated by reference as if fully set forth herein.

BACKGROUND OF THE INVENTION

Field of the Invention

The present invention relates to an organic light-emitting display device including an encapsulating layer for coupling an encapsulating substrate to a device substrate in which a light-emitting structure is formed.

Discussion of the Related Art

Generally, electronic appliances, such as a monitor, a TV, a laptop computer and a digital camera, include a display device to realize an image. For example, the display device can include a liquid crystal display device and/or an organic light-emitting display device.

The organic light-emitting display device can include light-emitting structures. The light-emitting structures can generate light realizing a specific color. For example, each of the light-emitting structures can include a first electrode, a light-emitting layer and a second electrode, which are sequentially stacked.

The organic light-emitting display device can have a structure capable of preventing damage of the light-emitting layer due to the permeation of external moisture. For example, the light-emitting display device can include an upper insulating layer disposed on the light-emitting structure, and an encapsulating layer disposed on the upper insulating layer. The upper insulating layer can include an inorganic insulating material. The encapsulating layer can include a moisture-absorbing material. A device substrate on which the light-emitting structure is formed, can be coupled with an encapsulating substrate by the encapsulating layer, so that the light-emitting structure is sealed. For example, the encapsulating layer can include a thermosetting resin.

However, in the organic light-emitting display device according to the related art, the light-emitting layer is vulnerable to heat, so that the light-emitting layer can be deteriorated due to heat generated during an operation of displaying an image. And, in the organic light-emitting display device, a step of coupling the encapsulating substrate to the device substrate includes a process of curing the encapsulating layer, so that the light-emitting structure can be damaged by a coupling process between the encapsulating substrate and the device substrate. Also, in the organic light-emitting display device, when the deterioration of the light-emitting layer due to the curing process of the encapsulating layer can be prevented by using an upper insulating layer, the light-emitting structure and/or a driving circuit for controlling the light-emitting structure can malfunction due to hydrogen generated in the upper insulating layer including an inorganic material.

SUMMARY OF THE INVENTION

Accordingly, the present invention is directed to an organic light-emitting display device that substantially obviates one or more problems due to limitations and disadvantages of the related art.

An object of the present invention is to provide an organic light-emitting display device capable of rapidly emitting heat to the outside.

Another object of the present invention is to provide an organic light-emitting display device capable of preventing the deterioration of the light-emitting layer due to the coupling process between the device substrate and the encapsulating substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic light-emitting display device according to an embodiment of the present invention including a device substrate. The device substrate includes a display area and a non-display area. The non-display area is disposed outside the display area. A light-emitting structure is disposed on the display area of the device substrate. The light-emitting structure includes a first electrode, a light-emitting layer and a second electrode, which are sequentially stacked. A lower encapsulating layer is disposed on the light-emitting structure. The lower encapsulating layer is extended on the non-display area of the lower substrate. The lower encapsulating layer is in contact with the second electrode of the light-emitting structure. An upper encapsulating layer is disposed on the lower encapsulating layer. The upper encapsulating layer includes a moisture-absorbing material. An encapsulating substrate is disposed on the upper encapsulating layer. The encapsulating substrate includes a metal.

The lower encapsulating layer and the upper encapsulating layer can include an olefin-based material.

The upper encapsulating layer can include a material different from a material of the lower encapsulating layer.

The upper encapsulating layer can be in direct contact with the lower encapsulating layer.

An edge of the first electrode can be covered by a bank insulating layer. The second electrode can be extended on a side surface of the bank insulating layer close to the non-display area of the device substrate.

A thin film transistor can be disposed between the device substrate and the light-emitting structure. An over-coat layer can be disposed between the thin film transistor and the light-emitting structure. The over-coat layer can cover the thin film transistor. The second electrode can be extended on a side surface of the over-coat layer close to the non-display area of the device substrate.

A horizontal width of the lower encapsulating layer can be smaller than a horizontal width of the upper encapsulating layer.

The upper encapsulating layer can be extended on a side surface of the lower encapsulating layer.

Magnetic particles can be disposed on the encapsulating substrate.

A capping layer can be disposed on the encapsulating substrate. The capping layer can include an insulating material. The magnetic particles can be dispersed in the capping layer.

In another embodiment, the organic light-emitting display device includes an encapsulating substrate disposed on a device substrate. The encapsulating substrate includes a metal. A lower encapsulating layer is disposed between the device substrate and the encapsulating substrate. An upper encapsulating layer is disposed between the lower encapsulating layer and the encapsulating substrate. The upper encapsulating layer includes a moisture-absorbing material. A light-emitting structure is disposed between the device substrate and the lower encapsulating layer. The light-emitting structure is in contact with the lower encapsulating layer. The lower encapsulating layer includes a portion being in contact with the device substrate on the outside of the light-emitting structure.

An upper surface of the lower encapsulating layer facing the encapsulating substrate can be a flat surface.

The encapsulating substrate can have a clad structure in which a first base substrate, a metal substrate including a metal, and a second base substrate are sequentially stacked.

The metal substrate can have a heat conductivity rate higher than the first base substrate and the second base substrate.

The metal of the metal substrate or the encapsulating substrate can include aluminum (Al) or chrome (Cr).

The metal substrate can be a thicker than the first base substrate and the second base substrate.

The first substrate and the second base substrate can have a coefficient of thermal expansion lower than the metal substrate.

The second base substrate can include a same material as the first base substrate.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 1:
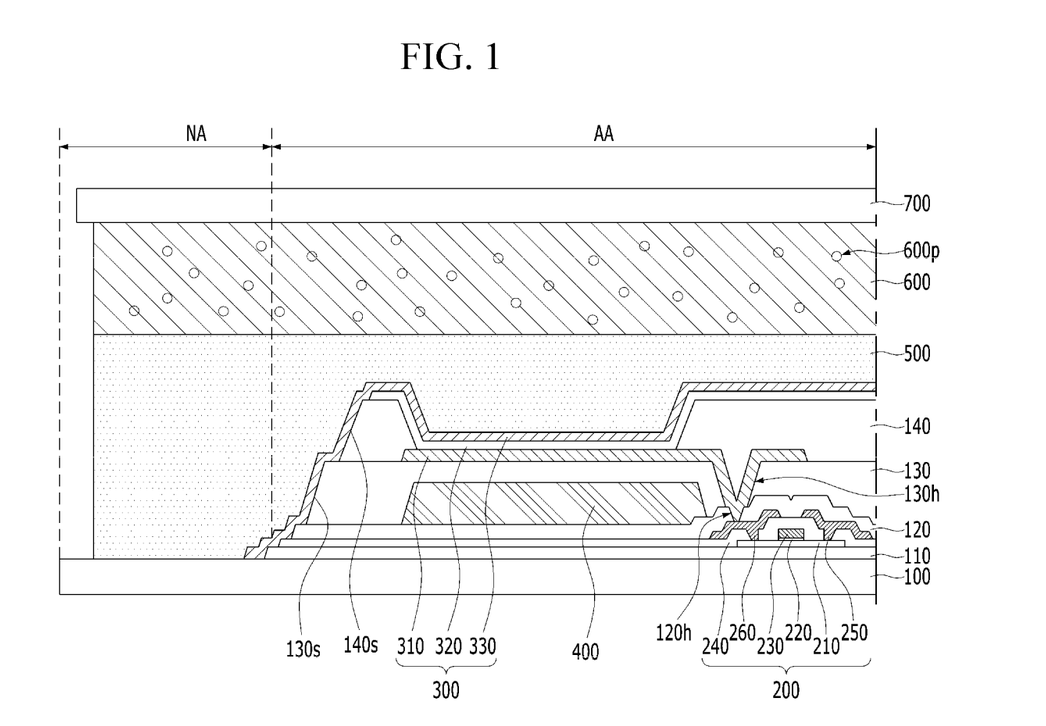
FIG. 1 is a view schematically showing an organic light-emitting display device according to an embodiment of the present invention.

FIG. 1 is a view showing an organic light-emitting display device according to an embodiment of the present invention. FIGS. 2 to 5 are views respectively showing an organic light-emitting display device according to another embodiment of the present invention. All the components of the organic light-emitting display device according to all embodiments of the present invention are operatively coupled and configured.

Referring to FIG. 1, the organic light-emitting display device according to the embodiment of the present invention can include a device substrate 100, a plurality of light-emitting structures 300, a lower encapsulating layer 500, an upper encapsulating layer 600 and an encapsulating substrate 700.

The device substrate 100 can support the light-emitting structures 300. The device substrate 100 can include an insulating material. The device substrate 100 can include a transparent material. For example, the device substrate 100 can include glass or plastic.

The device substrate 100 can include a display area AA and a non-display area NA. The non-display area NA can be disposed outside the display area AA. For example, the non-display area NA can include an edge of the device substrate 100.

The organic light-emitting display device according to the embodiment of the present invention can further include a plurality of thin film transistors 200 disposed on the display area AA of the device substrate 100. Each thin film transistor 200 can be disposed between the device substrate 100 and the corresponding light-emitting structure 300. For example, the thin film transistor 200 can include a semiconductor pattern 210, a gate insulating layer 220, a gate electrode 230, an interlayer insulating layer 240, a source electrode 250 and a drain electrode 260.

The semiconductor pattern 210 can be disposed close to the device substrate 100. The semiconductor pattern 210 can include a semiconductor material. For example, the semiconductor pattern 210 can include amorphous silicon or poly-silicon. The semiconductor pattern 210 can be an oxide semiconductor. For example, the semiconductor pattern 210 can include IGZO.

The semiconductor pattern 210 can include a source region, a drain region and a channel region. The channel region can be disposed between the source region and the drain region. The conductivity of the channel region can be lower than the conductivities of the source region and the drain region. For example, the source region and the drain region can include a conductive impurity.

The gate insulating layer 220 can be disposed on the semiconductor pattern 210. A size of the gate insulating layer 220 can be smaller than a size of the semiconductor pattern 210. For example, the gate insulating layer 220 can overlap with the channel region of the semiconductor pattern 210.

The gate insulating layer 220 can include an insulating material. For example, the gate insulating layer 220 can include silicon oxide and/or silicon nitride. The gate insulating layer 220 can include a high-K material. For example, the gate insulating layer 220 can include hafnium oxide (HfO) or titanium oxide (TiO). The gate insulating layer 220 can have a multi-layer structure.

The gate electrode 230 can be disposed on the gate insulating layer 220. For example, the gate electrode 230 can overlap the channel region of the semiconductor pattern 210. The gate electrode 230 can be insulated from the semiconductor pattern 210 by the gate insulating layer 220. For example, a side surface of the gate electrode 230 can be vertically aligned with a side surface of the gate insulating layer 220.

The gate electrode 230 can include a conductive material. For example, the gate electrode 230 can include a metal, such as aluminum (Al), chrome (Cr), molybdenum (Mo) and tungsten (W).

The interlayer insulating layer 240 can be disposed on the semiconductor pattern 210 and the gate electrode 230. The interlayer insulating layer 240 can be extended beyond the semiconductor pattern 210. For example, a side surface of the semiconductor pattern 210 can be covered by the interlayer insulating layer 240.

The interlayer insulating layer 240 can include an insulating material. For example, the interlayer insulating layer 240 can include silicon oxide.

The source electrode 250 can be disposed on the interlayer insulating layer 240. The source electrode 250 can be electrically connected to the source region of the semiconductor pattern 210. For example, the source electrode 250 can overlap the source region of the semiconductor pattern 210. The interlayer insulating layer 240 can include a contact hole partially exposing the source region of the semiconductor pattern 210.

The source electrode 250 can include a metal, such as aluminum (Al), chrome (Cr), molybdenum (Mo) and tungsten (W). The source electrode 250 can include a material different from the gate electrode 230.

The drain electrode 260 can be disposed on the interlayer insulating layer 240. The drain electrode 260 can be electrically connected to the drain region of the semiconductor pattern 210. The drain electrode 260 can be spaced away from the source electrode 250. For example, the drain electrode 260 can overlap the drain region of the semiconductor pattern 210. The interlayer insulating layer 240 can further include a contact hole partially exposing the drain region of the semiconductor pattern 210.

The drain electrode 260 can include a conductive material. For example, the drain electrode 260 can include a metal, such as aluminum (Al), chrome (Cr), molybdenum (Mo) and tungsten (W). The drain electrode 260 can include a material different from the gate electrode 230. The drain electrode 260 can include a same material as the source electrode 250.

The organic light-emitting display device according to the embodiment of the present invention can further comprise a buffer layer 110 disposed between the device substrate 110 and the thin film transistor 200. For example, the buffer layer 110 can be extended between the device substrate 100 and the semiconductor pattern 210. The buffer layer 110 can include an insulating material. For example, the buffer layer 110 can include silicon oxide.

The organic light-emitting display device according to the embodiment of the present invention can further comprise a lower passivation layer 120 disposed on the thin film transistor 200. The lower passivation layer 120 can prevent the thin film transistor from external moisture. For example, the lower passivation layer 120 can be extended along the interlayer insulating layer 240 in the outside of the semiconductor pattern 210. The lower passivation layer 120 can include an insulating material. The lower passivation layer can include a material different from the interlayer insulating layer 240. For example, the lower passivation layer can include silicon nitride.

The organic light-emitting display device according to the embodiment of the present invention can further comprise an over-coat layer 130. The over-coat layer 130 can remove a thickness difference due to the thin film transistor 200. For example, an upper surface of the over-coat layer 130 opposite to the device substrate 100 can be a flat surface. The over-coat layer 130 can include an insulating material. The over-coat layer 130 can include a material different from the lower passivation layer 120. For example, the over-coat layer 130 can include an organic insulating material.

The light-emitting structure 300 can generate light realizing a specific color. For example, the light-emitting structure 300 can include a first electrode 310, a light-emitting layer 320 and a second electrode 330, which are sequentially stacked.

The first electrode 310 can be disposed close to the device substrate 100. The light-emitting structure 300 can be controlled by the thin film transistor 200. For example, the first electrode 310 can be electrically connected to the drain electrode 260 of the thin film transistor 200. The light-emitting structure 300 can be disposed on the over-coat layer 130. The over-coat layer 130 can include an upper contact hole 130h exposing at least portion of the drain electrode 260. The lower passivation layer 120 can include a lower contact hole 120h overlapping with the upper contact hole 130h. The first electrode 310 can be extended along a side wall of the lower contact hole 120h and a side wall of the upper contact hole 130h.

The first electrode 310 can include a conductive material. The first electrode 310 can include a transparent material. For example, the first electrode 310 can be a transparent electrode formed of a transparent material, such as ITO and IZO.

The light-emitting layer 320 can generate light having luminance corresponding to a voltage difference between the first electrode 310 and the second electrode 330. For example, the light-emitting layer 320 can include an emission material layer (EML) having an emission material. The emission material can be an organic material.

The light-emitting layer 320 can have a multi-layer structure in order to increase luminous efficacy. For example, the light-emitting layer 320 can further include at least one of a hole injection layer (HIL), a hole transporting layer (HTL), an electron transporting layer (ETL) and an electron injection layer (EIL).

The second electrode 330 can include a conductive material. The second electrode 330 can include a material different from a material of the first electrode 310. For example, the second electrode 330 can include a metal having high reflectance, such as aluminum (Al). Thus, in the organic light-emitting display device according to the embodiment of the present invention, the light generated by the light-emitting layer 320 can be emitted to outside through the device substrate 110.

As mentioned above, the organic light-emitting display device according to the embodiment of the present invention can include the plurality of the light-emitting structures 300. Each of the light-emitting structures 300 can be independently driven. For example, the first electrode 310 of each light-emitting structure 300 can be separated from the first electrode 310 of adjacent light-emitting structure 300. The organic light-emitting display device according to the embodiment of the present invention can further comprise a bank insulating layer 140. The bank insulating layer 140 can include an insulating material. For example, the bank insulating layer 140 can include an organic insulating material. The bank insulating layer 140 can include a material different from the over-coat layer 130.

The light-emitting layer 320 and the second electrode 330 can be stacked on a portion of the first electrode 310 which is exposed by the bank insulating layer 140. The thin film transistor 200 can overlap the bank insulating layer 140. Thus, in organic light-emitting display device according to the embodiment of the present invention, the light toward the device substrate 100 from the light-emitting layer 320 may be not blocked by the thin film transistor 200.

The second electrode 330 can be extended on the bank insulating layer 140. For example, the second electrode 330 can be extended on a side surface 140s of the bank insulating layer 140 disposed close to the non-display area NA of the device substrate 100. The side surface 140s of the bank insulating layer 140 disposed close to the non-display area NA of the device substrate 100 can be completely covered by the second electrode 330. Thus, in the organic light-emitting display device according to the embodiment of the present invention, the second electrode 330 can prevent the bank insulating layer 140 from being function as the permeation path of external moisture.

The second electrode 330 can be extended on a side surface 130s of the over-coat layer 130 disposed close to the non-display area NA of the device substrate 100. For example, the second electrode 330 can completely cover the side surface 130s of the over-coat layer 130 disposed close to the non-display area NA of the device substrate 100. Thus, in the organic light-emitting display device according to the embodiment of the present invention, the permeation of external moisture through an insulating layer stacked between the device substrate 100 and the second electrode 330, and a boundary between the adjacent insulating layers, can be prevented.

The organic light-emitting display device according to the embodiment of the present invention can further comprise a color filter 400 disposed between the device substrate 100 and the light-emitting structure 300. For example, the color filter 400 can be disposed between the lower passivation layer 120 and the over-coat layer 130. A thickness difference due to the color filter 400 can be removed by the over-coat layer 130. The color filter 400 can convert the color realized by the light which is generated by the light-emitting layer 320. For example, the light-emitting layer 320 can generate light realizing white color, and the color filter 400 can realize blue color, red color or green color by using the light which is generated by the light-emitting layer 320. A horizontal width of the color filter 400 can be larger than a horizontal width of a portion of the first electrode exposed by the bank insulating layer 140. Thus, in the organic light-emitting display device according to the embodiment of the present invention, the leakage of the light can be prevented.

The lower encapsulating layer 500 can be disposed on the light-emitting structure 300. The lower encapsulating layer 500 can be extended on the non-display area NA of the device substrate 100. For example, the lower encapsulating layer 500 can include a portion being in direct contact with the device substrate 100 in the outside of the light-emitting structure 300. Thus, in the organic light-emitting display device according to the embodiment of the present invention, the light-emitting structure 300 can be sealed by the encapsulating layer 500.

The lower encapsulating layer 500 can be in contact with the light-emitting structure 300. For example, an upper surface of the second electrode 330 opposite to the device substrate 100 can be in direct contact with the lower encapsulating layer 500. The lower encapsulating layer 500 can surround an end portion of the second electrode 330 which is contact with the device substrate 100. An upper surface of the lower encapsulating layer 500 opposite to the device substrate 100 can be a flat surface. A thickness difference due to the light-emitting structure 300 can be removed by the lower encapsulating layer 500.

The lower encapsulating layer 500 can include an insulating material. The lower encapsulating layer 500 can include an adhesive material. For example, the lower encapsulating layer 500 can include an olefin based material.

The upper encapsulating layer 600 can be disposed on the lower encapsulating layer 500. For example, the upper encapsulating layer 600 can be in direct contact with the lower encapsulating layer 500. The upper encapsulating layer 600 can include a moisture-absorbing material 600p. Thus, in the organic light-emitting display device according to the embodiment of the present invention, the moisture permeating through the lower encapsulating layer 500, can be collected by the moisture-absorbing material 600p of the upper encapsulating layer 600. And, in the organic light-emitting display device according to the embodiment of the present invention, the stress applied to the light-emitting structure 300 due to the expansion of the moisture-absorbing material 600p, can be relieved by the lower encapsulating layer 500. Therefore, in the organic light-emitting display device according to the embodiment of the present invention, an additional technical feature for preventing the light-emitting structure 300 from external moisture, may be not formed.

The upper encapsulating layer 600 can be disposed on the display area AA and the non-display area NA of the device substrate 100. For example, the upper encapsulating layer 600 can include a side surface vertically aligned with a side surface of the lower encapsulating layer 500. The side surface of the upper encapsulating layer 600 can be continuously with the side surface of the lower encapsulating layer 500 on the non-display area NA of the device substrate 100. Thus, in the organic light-emitting display device according to the embodiment of the present invention, the permeation of the moisture through the encapsulating layer 500 can be efficiently prevented by the upper encapsulating layer 600.

The upper encapsulating layer 600 can include an insulating material. The upper encapsulating layer 600 can include an adhesive material. The upper encapsulating layer 600 can include a material which does not need a curing process. For example, the upper encapsulating layer 600 can include an olefin-based material. Thus, in the organic light-emitting display device according to the embodiment of the present invention, the deterioration of the light-emitting layer 320 due to a process of forming the lower encapsulating layer 500 and the upper encapsulating layer 600, can be prevented.

The upper encapsulating layer 600 can include a material different from the lower encapsulating layer 500. For example, the lower encapsulating layer 500 can include a material having high elasticity than the upper encapsulating layer 600. Thus, in the organic light-emitting display device according to the embodiment of the present invention, the stress applied to the light-emitting structure 300 due to the expansion of the moisture-absorbing material, can be relieved without the moisture collecting rate of the upper encapsulating layer 600.

The encapsulating substrate 700 can be disposed on the upper encapsulating layer 600. For example, an upper surface of the encapsulating layer 600 opposite to the device substrate 100 can be in direct contact with the encapsulating substrate 700. The encapsulating substrate 700 can overlap the display area AA and the non-display area NA of the device substrate 100. The size of the encapsulating substrate 700 can be smaller than the size of the device substrate 100. For example, a side surface of the encapsulating substrate 700 can be disposed between a side surface of the device substrate 100 and the side surface of the upper encapsulating layer 600. An edge portion of a lower surface of the encapsulating substrate 700 facing the device substrate 100 can be exposed by the upper encapsulating layer 600. Thus, in the organic light-emitting display device according to the embodiment of the present invention, the fail due to the miss-alignment of the upper encapsulating layer 600 can be prevented.

The encapsulating substrate 700 can include a material having a hardness of at least a certain level. For example, the encapsulating substrate 700 can include a metal having relatively higher the heat conductive rate, such as aluminum (Al). Thus, in the organic light-emitting display device according to the embodiment of the present invention, heat generated by the operation of realizing a image, can be emitted to the outside by the lower encapsulating layer 500, the upper encapsulating layer 600, and the encapsulating substrate 700.

That is, in the organic light-emitting display device according to the embodiment of the present invention, the encapsulating layer 500 and 600 coupling the encapsulating substrate 700 including a metal to the device substrate 100 in which the light-emitting structure 300 is formed, can be in direct contact with the light-emitting structure 300, so that the heat dissipation can be improved. Also, in the organic light-emitting display device according to the embodiment of the present invention, the light-emitting structure 300 can be completely covered by the lower encapsulating layer 500 stacked on the light-emitting structure 300, and the moisture-absorbing material can be only disposed in the upper encapsulating layer 600 stacked on the lower encapsulating layer 500, so that electrically connection between the second electrode 330 of the light-emitting structure 300 and the encapsulating substrate 700 including a metal due to the moisture-absorbing material absorbing the permeated moisture, can be prevented. In addition, the organic light-emitting display device according to the embodiment of the present invention can include the lower encapsulating layer 500 and the upper encapsulating layer 600 which are formed without a process of curing, so that the deterioration of the light-emitting layer 320 due to a process of coupling the encapsulating substrate 700 to the device substrate 100 can be prevented. Accordingly, in the organic light-emitting display device according to the embodiment of the present invention, a space between the device substrate 100 in which the light-emitting structure 300 is formed and the upper encapsulating layer 600 including the moisture-absorbing material can be filled by the lower encapsulating layer 500, and the lower encapsulating layer 500 and the upper encapsulating layer 600 can be formed without a process of curing, so that the lift-time and the reliability of the light-emitting structure 300 can be increased.

Figure 2:
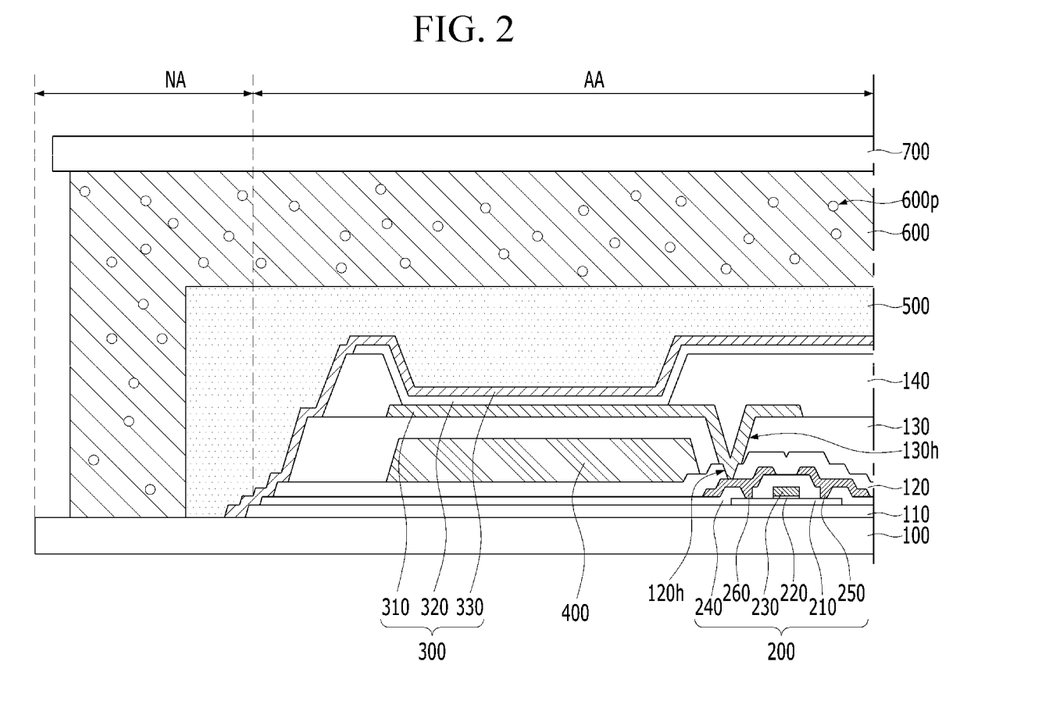
FIGS. 2 to 5 are views respectively showing an organic light-emitting display device according to another embodiment of the present invention.

The organic light-emitting display device according to the embodiment of the present invention is described that the horizontal width of the lower encapsulating layer 500 is equal to the horizontal width of the upper encapsulating layer 600. However, the organic light-emitting display device according to another embodiment of the present invention can include the upper encapsulating layer 600 having a size larger than the lower encapsulating layer 500. For example, in the organic light-emitting display device according to another embodiment of the present invention, the upper encapsulating layer 600 can be extended on the side surface of the lower encapsulating layer 500 on the non-display area NA of the device substrate 100, as shown in FIG. 2. In the organic light-emitting display device according to another embodiment of the present invention, the upper encapsulating layer 600 can include a portion being in direct contact with the non-display area NA of the device substrate 100. Thus, in the organic light-emitting display device according to another embodiment of the present invention, the permeation of external moisture can be prevented by the upper encapsulating layer 600 including the moisture-absorbing material, and the heat dissipation can be efficiently improved.

Figure 3:
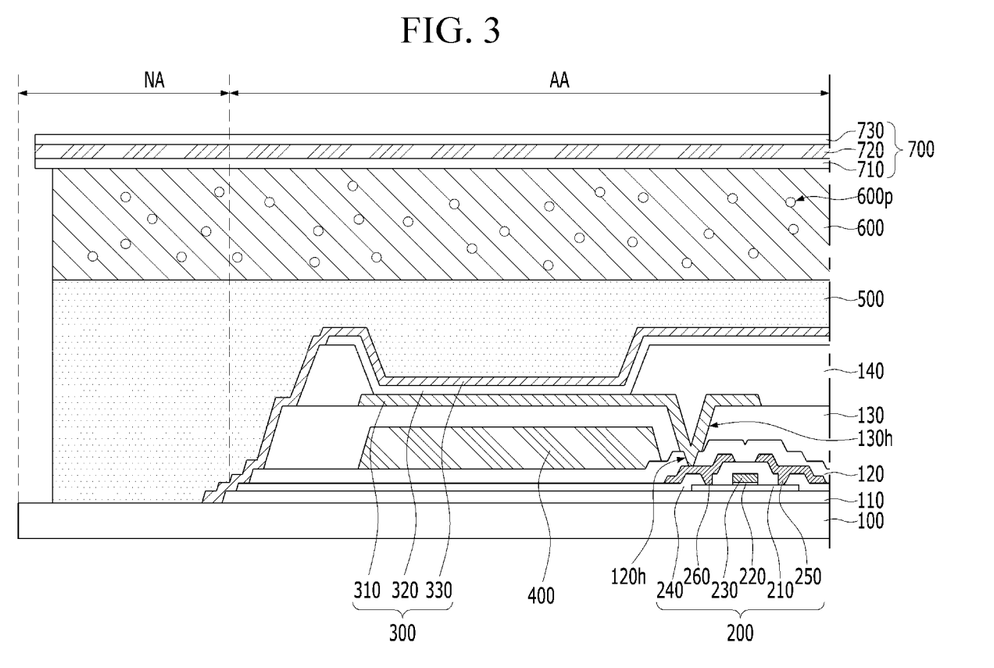

The organic light-emitting display device according to the embodiment of the present invention is described that the encapsulating substrate 700 is a single layer including a metal. However, the organic light-emitting display device according to another embodiment of the present invention can include the encapsulating substrate 700 having a multi-layer structure. For example, in the organic light-emitting display device according to another embodiment of the present invention, the encapsulating substrate 700 can include a clad structure in which a first base substrate 710, a metal substrate 720, and a second base substrate 730 are sequentially stacked, as shown in FIG. 3.

The metal substrate 720 can include a heat conductive rate higher than the first base substrate 710 and the second base substrate 730. For example, the metal substrate 710 can include a metal having high heat conductive rate, such as aluminum (Al) and chrome (Cr). The first base substrate 710 and the second base substrate 730 can include a material having hardness higher than the metal substrate 720. The first base substrate 710 and the second base substrate 730 can have a coefficient of thermal expansion lower than the metal substrate 720. The second base substrate 730 can include a same material as the first base substrate 710. For example, the first base substrate 710 and the second base substrate 730 can include SUS. Thus, in the organic light-emitting display device according to another embodiment of the present invention, bending due to the coefficient of thermal expansion difference between the device substrate 100 and the encapsulating substrate 700, and damage of the metal substrate 720 due to external impact can be minimized. Thereby, in the organic light-emitting display device according to another embodiment of the present invention, heat dissipation can be efficiently improved. The metal substrate 720 can be thicker than the first base substrate 710 and the second base substrate 730.

Figure 4:
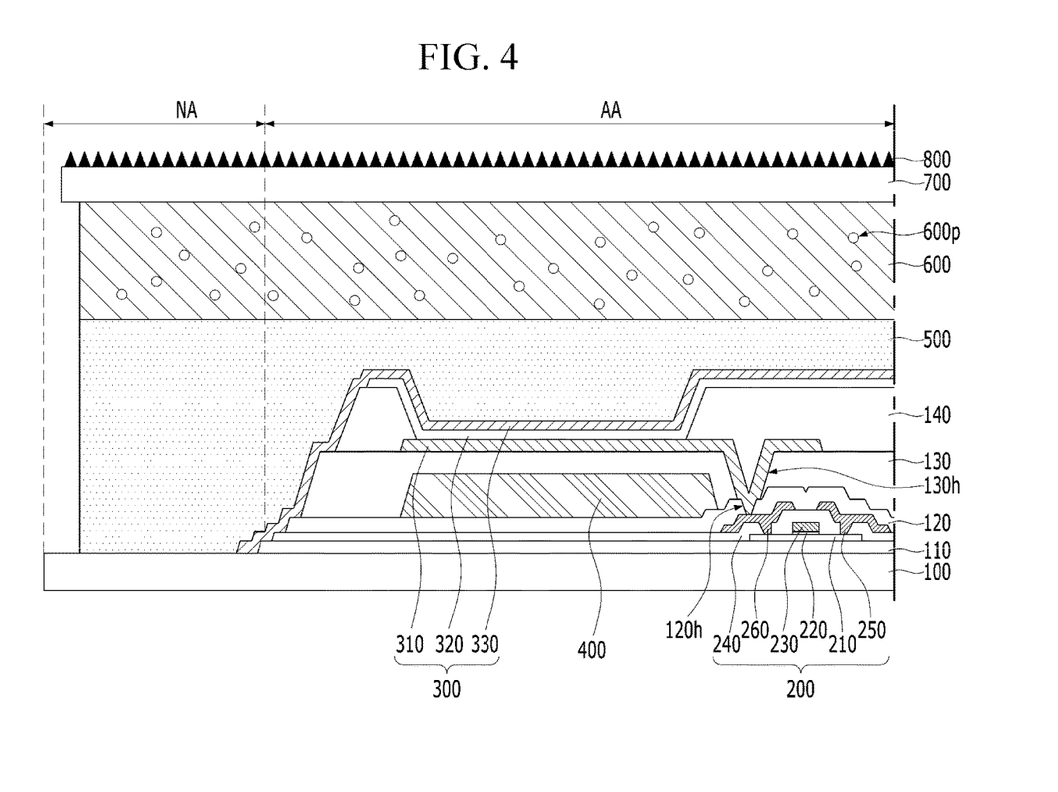

The organic light-emitting display device according to another embodiment of the present invention can secure magnetism by using magnetic particles. For example, the organic light-emitting display device according to another embodiment of the present invention can include magnetic particles 800 disposed on the encapsulating substrate 700, as shown in FIG. 4. The magnetic particles 800 can include a material having magnetic characteristics. For example, the magnetic particles 800 can include ferromagnetism metal, such as iron (Fe), Nickel (Ni), cobalt (Co). The magnetic particles 800 can be formed by a process of plating. For example, the magnetic particles 800 can be in direct contact with an outer surface of the encapsulating substrate 700. The magnetic particles 800 can be dispersed on the encapsulating substrate 700, regularly. Thus, in the organic light-emitting display device according to another embodiment of the present invention, the encapsulating substrate 700 can be moved by a jig including magnetic plate, so that the location of the encapsulating substrate 700 can be easily adjusted during a coupling process between the device substrate 100 and the encapsulating substrate 700. Also, in the organic light-emitting display device according to another embodiment of the present invention, the moving jig of the encapsulating substrate 700 can be simplified, so that damage of the encapsulating substrate 700 and/or the device substrate 100 during a process of attaching or detaching the encapsulating substrate 700 to the moving jig, can be prevented. In addition, in the organic light-emitting display device according to another embodiment of the present invention, a process of attaching and detaching the encapsulating substrate 700 to the moving jig can be simplified, so that time for a process of coupling between the device substrate 100 and the encapsulating substrate 700 can be reduced. And, in the organic light-emitting display device according to another embodiment of the present invention, the metal of the encapsulating substrate 700 can be selected regardless of the improvement of the forming efficiency, so that the efficiency of the heat dissipation can be effectively increased.

Figure 5:
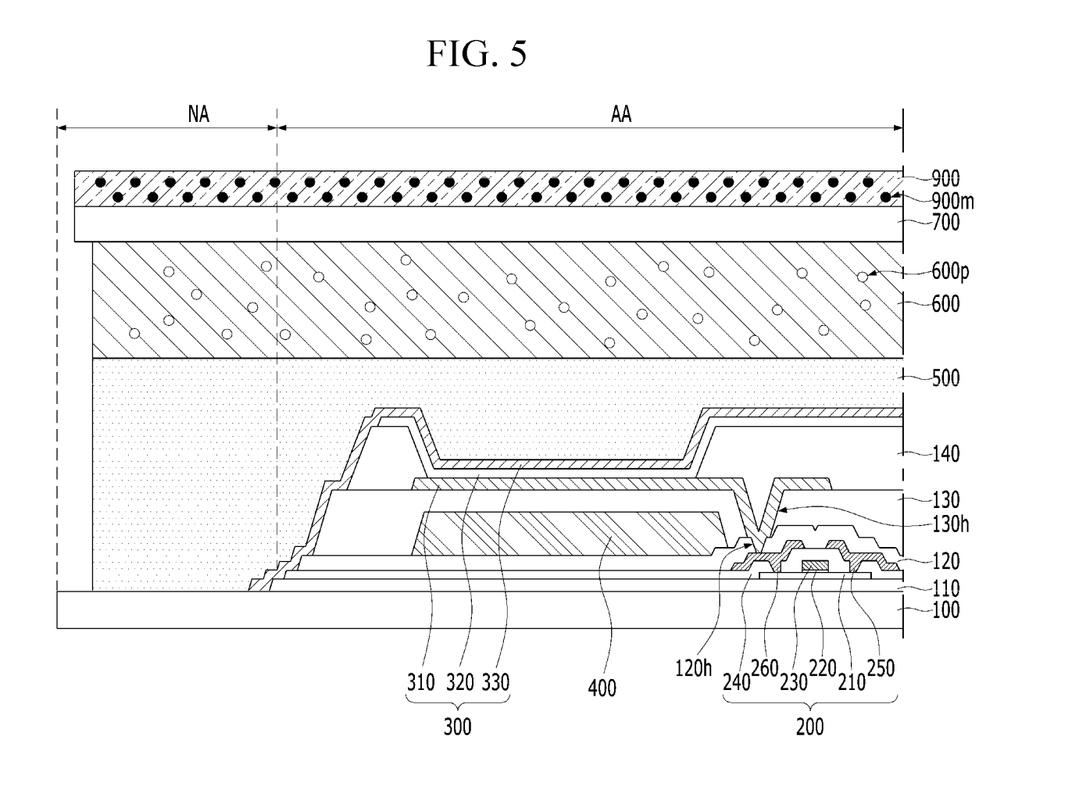

The organic light-emitting display device according to another embodiment of the present invention is described that the magnetic particles 800 is applied on the outer surface of the encapsulating substrate 700. However, the organic light-emitting display device according to further another embodiment of the present invention can include a capping layer 900 on the encapsulating substrate 700, and the magnetic particles 900m dispersed in the capping layer 900, as shown in FIG. 5. The capping layer 900 can include an insulating material. For example, the capping layer 900 can include silicon oxide. Thus, in the organic light-emitting display device according to further another embodiment of the present invention, damage of the encapsulating substrate 700 due to external impact can be prevented, and the efficiency of the heat dissipation and the process efficiency can be increased.

As a result, the organic light-emitting display device according to the embodiments of the present invention can include the encapsulating layer disposed between the encapsulating substrate including a metal and the device substrate in which the light-emitting structure is formed, wherein the encapsulating layer can include the lower encapsulating layer being in contact with the light-emitting structure, and the upper encapsulating layer including the moisture-absorbing material. Thus, in the organic light-emitting display device according to the embodiments of the present invention, the permeation of external moisture can be prevented, and the efficiency of heat dissipation can be increased. Thereby, in the organic light-emitting display device according to the embodiments of the present invention, life-time and reliability can be improved.

What is claimed is:

1. An organic light-emitting display device comprising:
a device substrate including a display area and a non-display area disposed outside the display area;
a light-emitting structure disposed on the display area of the device substrate, the light-emitting structure including a first electrode, a light-emitting layer and a second electrode, which are sequentially stacked;
an over-coat layer disposed between the device substrate and the light-emitting structure;
a lower encapsulating layer disposed on the light-emitting structure, the lower encapsulating layer extended on the non-display area of the device substrate;
a bank insulating layer covering an edge of the first electrode of the light-emitting structure;
an upper encapsulating layer disposed on the lower encapsulating layer, the upper encapsulating layer including a moisture-absorbing material; and
an encapsulating substrate disposed on the upper encapsulating layer, the encapsulating substrate including a metal,
wherein the lower encapsulating layer is in contact with the second electrode of the light-emitting structure,
wherein the second electrode of the light-emitting structure extends onto the non-display area of the device substrate along a side surface of the over-coat layer and a side surface of the bank insulating layer, which are closest to the non-display area of the device substrate, and
wherein the encapsulating substrate has a clad structure in which a first base substrate, a metal substrate including a metal and a second base substrate are sequentially stacked.

2. The organic light-emitting display device according to claim 1, wherein the lower encapsulating layer and the upper encapsulating layer include an olefin-based material.

3. The organic light-emitting display device according to claim 2, wherein the upper encapsulating layer includes a material different from a material of the lower encapsulating layer.

4. The organic light-emitting display device according to claim 1, wherein the upper encapsulating layer is in direct contact with the lower encapsulating layer.

5. The organic light-emitting display device according to claim 1, further comprising: a thin film transistor disposed between the device substrate and the over-coat layer.

6. The organic light-emitting display device according to claim 1, wherein a horizontal width of the lower encapsulating layer is smaller than a horizontal width of the upper encapsulating layer.

7. The organic light-emitting display device according to claim 6, wherein the upper encapsulating layer is extended on a side surface of the lower encapsulating layer, on the non-display area of the device substrate.

8. The organic light-emitting display device according to claim 1, further comprising magnetic particles disposed on the encapsulating substrate.

9. The organic light-emitting display device according to claim 8, further comprising a capping layer disposed on the encapsulating substrate, the capping layer including an insulating material,
wherein the magnetic particles are dispersed in the capping layer.

10. An organic light-emitting display device comprising:
an encapsulating substrate disposed on a device substrate;
a lower encapsulating layer disposed between the device substrate and the encapsulating substrate;
an upper encapsulating layer disposed between the lower encapsulating layer and the encapsulating substrate, the upper encapsulating layer including a moisture-absorbing material;
a light-emitting structure disposed between the device substrate and the lower encapsulating layer, the light-emitting structure having an electrode which is in contact with the lower encapsulating layer; and
at least one insulating layer disposed between the device substrate and the light-emitting structure,
wherein the electrode of the light-emitting structure extends along a side surface of the at least one insulating layer closest to an edge of the device substrate,
wherein the lower encapsulating layer includes a portion being in contact with the device substrate at an outside of the electrode of the light-emitting structure, and
wherein the encapsulating substrate has a clad structure in which a first base substrate, a metal substrate including a metal and a second base substrate are sequentially stacked.

11. The organic light-emitting display device according to claim 10, wherein an upper surface of the lower encapsulating layer facing the encapsulating substrate is a flat surface.

12. The organic light-emitting display device according to claim 10, wherein the metal substrate has a heat conductivity rate higher than a heat conductivity rate of the first base substrate and the second base substrate.

13. The organic light-emitting display device according to claim 12, wherein the metal of the metal substrate includes aluminum (Al) or chrome (Cr).

14. The organic light-emitting display device according to claim 12, wherein the metal substrate is thicker than the first base substrate and the second base substrate.

15. The organic light-emitting display device according to claim 10, wherein the first base substrate and the second base substrate have a coefficient of thermal expansion lower than the metal substrate.

16. The organic light-emitting display device according to claim 15, wherein the second base substrate includes a same material as the first base substrate.

17. An organic light-emitting display device comprising:
an encapsulating substrate disposed on a device substrate;
a lower encapsulating layer disposed between the device substrate and the encapsulating substrate;
an upper encapsulating layer disposed between the lower encapsulating layer and the encapsulating substrate, the upper encapsulating layer including a moisture-absorbing material; and
a light-emitting structure disposed between the device substrate and the lower encapsulating layer, the light-emitting structure being in contact with the lower encapsulating layer,
wherein the lower encapsulating layer includes a portion being in contact with the device substrate at an outside of the light-emitting structure,
wherein an upper surface of the lower encapsulating layer facing the encapsulating substrate is a flat surface, and
wherein the encapsulating substrate has a clad structure in which a first base substrate, a metal substrate including a metal and a second base substrate are sequentially stacked.

* * * * *